(12) United States Patent
Nitsch

(10) Patent No.: US 11,689,392 B2
(45) Date of Patent: Jun. 27, 2023

(54) PARALLEL FILTER STRUCTURE, OSCILLOSCOPE AND METHOD OF PROCESSING A SIGNAL

(71) Applicant: Rohde & Schwarz GmbH & Co. KG, Munich (DE)

(72) Inventor: Bernhard Nitsch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/540,690

(22) Filed: Dec. 2, 2021

(65) Prior Publication Data

US 2022/0224571 A1 Jul. 14, 2022

(30) Foreign Application Priority Data

Jan. 11, 2021 (EP) ..................................... 21150926

(51) Int. Cl.
*H04L 25/03* (2006.01)

(52) U.S. Cl.
CPC .............................. *H04L 25/03057* (2013.01)

(58) Field of Classification Search
CPC ...... H03H 2017/0081; H03H 2017/009; H04L 25/03006; H04L 25/03019; H04L 25/03038; H04L 25/03057; H04L 25/03267
USPC ........ 375/232, 233, 346, 348, 350; 708/322, 708/323
See application file for complete search history.

(56) References Cited

U.S. PATENT DOCUMENTS

| | | | |
|---|---|---|---|
| 5,539,774 A * | 7/1996 | Nobakht | H04L 25/03267 375/232 |
| 6,577,259 B1 * | 6/2003 | Jelonnek | H03M 7/3022 341/143 |
| 7,184,478 B2 * | 2/2007 | Popescu | H04L 7/033 375/232 |
| 9,077,574 B1 | 7/2015 | Healey et al. | |
| 9,215,107 B1 * | 12/2015 | De Bernardinis | H04L 7/0062 |
| 9,246,452 B2 * | 1/2016 | Zhong | H03G 1/0029 |
| 10,187,234 B1 * | 1/2019 | Shahramian | H04L 27/01 |
| 10,396,911 B1 | 8/2019 | Miller | |
| 2005/0220185 A1 | 10/2005 | Dowling | |
| 2008/0061883 A1 * | 3/2008 | Kataria | H03F 3/50 330/289 |
| 2016/0344372 A1 | 11/2016 | Kuhwald et al. | |
| 2019/0383873 A1 * | 12/2019 | Hojabri | G01R 31/2841 |
| 2020/0295850 A1 * | 9/2020 | Schaefer | H04B 1/16 |

* cited by examiner

*Primary Examiner* — Young T. Tse
(74) *Attorney, Agent, or Firm* — Christensen O'Connor Johnson Kindness PLLC

(57) ABSTRACT

The present disclosure relates to a parallel filter structure for processing a signal. The parallel filter structure includes a signal input configured to receive a time and value discrete input signal. The parallel filter structure includes a feed forward equalizer circuit connected with the signal input for receiving the time and value discrete input signal. The parallel filter structure includes a decision feedback equalizer circuit connected with the signal input for receiving the time and value discrete input signal. The feed forward equalizer circuit and the decision feedback equalizer circuit together form a parallel circuit. Further, an oscilloscope and a method of processing a signal are provided.

20 Claims, 2 Drawing Sheets

PARALLEL FILTER STRUCTURE, OSCILLOSCOPE AND METHOD OF PROCESSING A SIGNAL

TECHNICAL FIELD

Embodiments of the present disclosure generally relate to a parallel filter structure for processing a signal. Further, embodiments of the present disclosure relate to an oscilloscope. In addition, embodiments of the present disclosure also relate to a method of processing a signal.

BACKGROUND

In test and measurement instruments, e.g. oscilloscopes, it is known that an input signal is processed such that a time and value discrete input signal is obtained, namely a digitized signal. The digitized signal may be inputted directly or gathered by processing an analog input signal, namely sampling the analog input signal, thereby obtaining samples.

The time and value discrete input signal is internally processed by the test and measurement instrument in order to obtain certain information that is outputted, for instance via an eye diagram. Therefore, the time and value discrete input signal is internally processed by a filter structure, for instance a decision feedback equalizer (DFE) circuit. The decision feedback equalizer circuit is a filter that utilizes its previous decisions in making a decision on the present signal (portion) to be processed.

In addition to the eye diagram functionality, the test and measurement instrument may also comprise a real-time trigger functionality that is usually realized by a continuous time linear equalizer (CTLE) together with a feed forward equalizer (FFE) circuit that requires less hardware resources compared to a decision feedback equalizer circuit due to its feedforward structure. Typically, the CTLE is used by a clock recovery (CR) to open an eye within the eye diagram of the signal distorted by the transmission channel to the extent that the CR is enabled to estimate the symbol clock.

However, the FFE and the DFE have different equalization characteristics, resulting in different equalization functions when processing the same signal, yielding problems concerning the comparability of the respective output signals of both equalizer circuits.

Accordingly, there is a need for an improved internal processing of a signal.

SUMMARY

The present disclosure provides examples of a parallel filter structure for processing a signal. In an embodiment, the parallel filter structure comprises a signal input configured to receive a time and value discrete input signal. The parallel filter structure also comprises a feed forward equalizer (FFE) circuit connected with the signal input for receiving the time and value discrete input signal. The parallel filter structure may also comprise a decision feedback equalizer (DFE) circuit connected with the signal input for receiving the time and value discrete input signal, namely the same signal as the FFE circuit. The feed forward equalizer circuit and the decision feedback equalizer circuit together form a parallel circuit.

Accordingly, the parallel filter structure comprises both the feed forward equalizer circuit and the decision feedback equalizer circuit that together form the parallel circuit such that both equalizer circuits process the same time and value discrete input signal in parallel. Therefore, respective output signals of the equalizer circuits are obtained that are based on the same time and value discrete input signal.

In general, the FFE circuit is, in one embodiment, a finite impulse response (FIR) filter that is used to compensate pre- and post-oscillations of a channel impulse response, thereby reducing the influence of an inter-symbol interference (ISI) on the symbol decision, thereby reducing the risk of false decision. In some embodiments, the FFE circuit is enabled to enlarge the eye opening in a respective eye diagram.

The DFE circuit is a combination of, for example, a finite impulse response (FIR) filter and, for example, an infinite impulse response (IIR) filter, thereby providing two filter portions, namely a FIR portion for compensating the pre- and post-oscillations of the channel impulse response as well as an IIR portion for only compensating post-oscillations of the channel impulse response. Thus, the DFE circuit has filter coefficients or equalizer parameters that are associated with the FIR portion and the IIR portion, respectively. Due to the additional IIR characteristics, the DFE circuit requires less filter coefficients or equalizer parameters compared with the FFE circuit.

In general, the FFE circuit may be used for equalizing pre-cursor samples of the channel impulse response; whereas the DFE circuit is used to equalize post-cursor samples. Accordingly, the DFE circuit is more robust in application scenarios with high noise content, as the symbol decision has noise-suppressing properties. Thus, the FFE circuit may be preferred in application scenarios with high ISI components.

An aspect provides that the feed forward equalizer circuit and the decision feedback equalizer circuit are communicatively connected with each other. In other words, a communication line is established between both equalizer circuits. Therefore, data and/or information may be exchanged among the respective equalizer circuits, thereby ensuring that certain settings of the equalizer circuits may be adapted based on data/information provided by the other equalizer circuit accordingly. For instance, the data and/or information is gathered from the output signal(s) of the respective equalizer circuit(s).

Another aspect provides that at least one feed forward equalizer parameter of the feed forward equalizer circuit is set depending on at least one decision feedback equalizer parameter of the decision feedback equalizer circuit. The respective equalizer parameter relates to a filter parameter of the corresponding equalizer circuit. In other words, the setting of the feed forward equalizer circuit is done at least partly based on the decision feedback equalizer circuit, namely a filter parameter associated therewith. Put differently, a respective filter parameter of the decision feedback equalizer circuit is outputted or derived, e.g., from the output signal, based on which the filter parameter of the feed forward equalizer circuit is parameterized.

Generally, the communication established between both equalizer circuits ensures that their equalizing properties or equalizing characteristics are adapted with respect to each other, thereby obtaining equivalent equalizing functions.

The dependency may be determined based on a minimum of a cost function. In some embodiments, the parallel filter structure comprises a processing circuit that is configured to minimize the respective cost function. The at least one decision feedback equalizer parameter based on which the feed forward equalizer parameter is set may be used by the respective cost function that is minimized.

In some embodiments, the cost function comprises the error squared between an output signal of the feed forward equalizer circuit and an output signal of the decision feedback equalizer circuit. Therefore, the output signals of both equalizer circuits are set in relation to each other, wherein the respective deviations are squared, thereby generating the cost function that shall be minimized in order to identify the respective parametrization for the feed forward equalizer circuit, namely the setting of the at least one feed forward equalizer parameter.

A further aspect provides that the parallel filter structure is implemented on a single chip, for example an application-specific integrated circuit (ASIC). In another embodiment, a field-programmable gate array (FPGA) may be used or other similarly constructed processor circuit.

Therefore, a single chip may be provided that encompasses the feed forward equalizer circuit and the decision feedback equalizer circuit that are established as the parallel circuit on the single chip. Further, the chip comprises the signal input that is connected with the parallel circuit, namely the feed forward equalizer circuit and the decision feedback equalizer circuit.

For instance, the feed forward equalizer circuit is implemented in a real time section of the chip. This ensures that the feed forward equalizer circuit can be used for a respective trigger functionality, for example a real-time trigger functionality.

Further, the decision feedback equalizer circuit may be implemented in a non-real time section of the chip. The decision feedback equalizer circuit has a feedback structure such that it may be located in the non-time critical section of the chip.

Another aspect provides that an output signal of the feed forward equalizer circuit is fed to an interface for a trigger circuit. In some embodiments, the parallel filter structure comprises the trigger circuit that is connected with the feed forward equalizer circuit. The output signal of the feed forward equalizer circuit may be used for the respective (real-time) trigger functionality, wherein the trigger circuit may be employed on the parallel filter structure itself.

Alternatively, the interface for the trigger circuit corresponds to an output interface of the parallel filter structure, for example the single chip, via which the parallel filter structure is connected with a separately formed chip on which the trigger circuit is provided.

Further, an output signal of the decision feedback equalizer circuit may be fed to an interface for an eye diagram circuit. In some embodiments, the parallel filter structure comprises the eye diagram circuit that is connected with the decision feedback equalizer circuit. The output signal of the decision feedback equalizer circuit may be used for the respective eye diagram functionality, wherein the eye diagram circuit may be employed on the parallel filter structure itself.

Alternatively, the interface for the eye diagram circuit corresponds to an output interface of the parallel filter structure, for example the single chip, via which the parallel filter structure is connected with a separately formed chip on which the eye diagram circuit is provided.

The present disclosure further provides an oscilloscope with a parallel filter structure according to any of the embodiments described above. Thus, the characteristics and advantages mentioned above with regard to the parallel filter structure also apply to the oscilloscope in a similar manner. The oscilloscope may also comprise a sampling circuit that samples or digitizes an analog input signal, thereby generating the time and value discrete input signal that is forwarded to the parallel filter structure, for example its signal input.

The oscilloscope may comprise a trigger circuit that is connected with an interface associated with a feed forward equalizer circuit that is separately formed with respect to the trigger circuit. The trigger circuit may be established on a separately formed chip with respect to the chip on which the feed forward equalizer circuit is provided, for example the entire parallel filter structure. Accordingly, the oscilloscope in some embodiments comprises at least two separately formed chips that are connected with each other.

Another aspect provides that the oscilloscope comprises an eye diagram circuit that is connected with an interface associated with the decision feedback equalizer circuit that is separately formed with respect to the eye diagram circuit. The eye diagram circuit may be established on a separately formed chip with respect to the chip on which the decision feedback equalizer circuit is provided, for example the entire parallel filter structure. Accordingly, the oscilloscope comprises in some embodiments at least two separately formed chips that are connected with each other.

In some embodiments, the oscilloscope comprises at least three separately formed chips that are associated with the parallel filter structure, the trigger circuit and the eye diagram circuit.

The present disclosure further provides a method of processing a signal. The method comprises the steps of:
Receiving a time and value discrete input signal via a signal input,
Filtering the time and value discrete input signal by a feed forward equalizer circuit of a parallel filter structure,
Filtering the time and value discrete input signal by a decision feedback equalizer circuit of the parallel filter structure, which together with the feed forward equalizer circuit forms a parallel circuit of the parallel filter structure.

Accordingly, embodiments of the parallel filter structure described above may be configured to perform the method of processing the signal. The time and value discrete input signal is processed by both equalizer circuits of the parallel circuit in parallel, thereby providing two output signals in parallel, which are associated with the respective equalizer circuits.

An aspect provides that at least one feed forward equalizer parameter of the feed forward equalizer circuit is set depending on at least one decision feedback equalizer parameter of the decision feedback equalizer circuit. Hence, the setting of the feed forward equalizer circuit is done at least partly based on the decision feedback equalizer circuit, namely a filter parameter associated therewith.

In some embodiments, the dependency is determined based on a minimum of a cost function. For instance, the cost function comprises the error squared between an output signal of the feed forward equalizer circuit and an output signal of the decision feedback equalizer circuit.

Further, if the sampling rate is significantly higher than the system clock rate of the chip, e.g., the ASIC, FPGA, SoC, etc., then a high degree of parallelism must be selected for signal processing for real-time capable functions. This leads to the fact that the resource requirement of feedback structures, such as the IIR portion of the DFE circuit depends more on the parallelism and less on the filter length of the IIR portion. Then, the resource requirement of a FFE circuit is often lower than the resource requirement of a DFE circuit.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
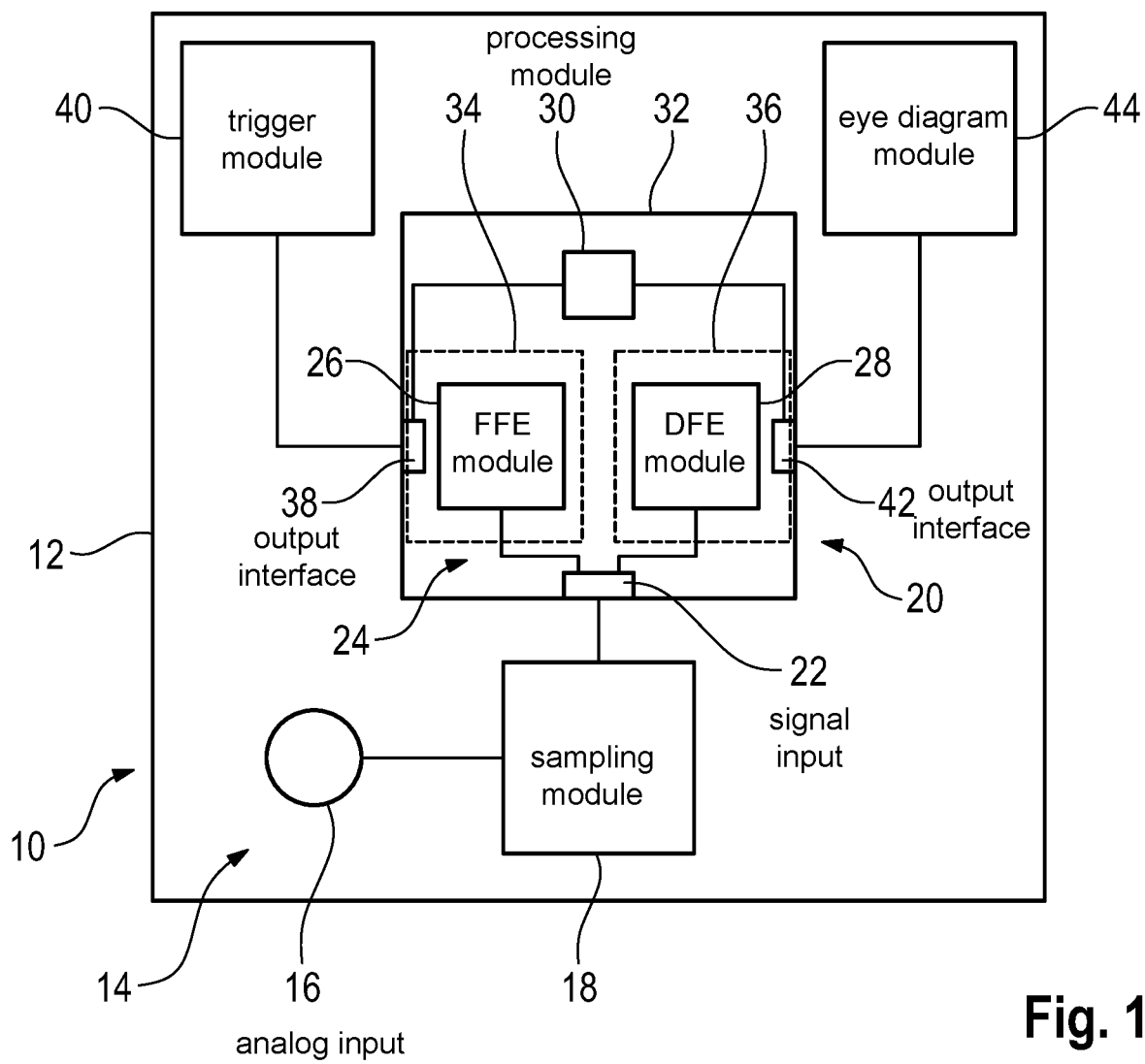
FIG. 1 schematically shows an oscilloscope according to an embodiment of the present disclosure, which comprises an embodiment of a parallel filter structure according to one or more aspects of the present disclosure.

FIG. 1 depicts an oscilloscope 10 for processing a signal. In the embodiment of FIG. 1, the oscilloscope 10 comprises a housing 12 with a front end 14. At the front end 14 of the oscilloscope 10, an analog input 16 is provided that is configured to receive an analog input signal. The analog input 16 is connected with a sampling circuit 18 that processes the analog input signal in order to generate a digitized signal, namely a time and value discrete input signal.

Figure 2:
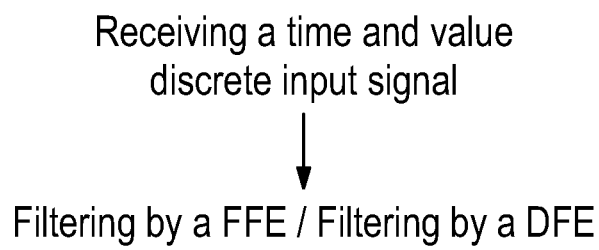
FIG. 2 schematically shows a flow-chart that illustrates a representative method of processing a signal according to an embodiment of the present disclosure.

The time and value discrete signal provided by the sampling circuit 18 is forwarded to a parallel filter structure 20 that processes the respective time and value discrete signal. The parallel filter structure 20 has a signal input 22 via which the time and value discrete input signal is received. In addition, the parallel filter structure 20 has a parallel circuit 24 that comprises two different equalizer circuits, namely a feed forward equalizer circuit 26 as well as a decision feedback equalizer circuit 28. As shown in FIG. 2, both equalizer circuits 26, 28 are connected with the signal input 22 such that both circuits 26, 28 receive the time and value discrete input signal that is processed by both equalizer circuits 26, 28 in parallel.

Returning to FIG. 1, the parallel filter structure 20 also comprises a processing circuit 30 that is interconnected between both equalizer circuits 26, 28, thereby establishing a communication connection between the equalizer circuits 26, 28. Accordingly, data/information of the respective equalizer circuits 26, 28 may be gathered, for example data/information of the decision feedback equalizer circuit 28, which may be used for setting at least one of the equalizer circuits 26, 28 appropriately.

For instance, the processing circuit 30 is assigned to output interfaces of the respective equalizer circuits 26, 28 such that output signals of the equalizer circuits 26, 28 are forwarded to the processing circuit 30 that processes the respective output signals.

Again, the processing circuit 30 receives at least the output signal of the decision feedback equalizer circuit 28 in order to obtain information associated with the decision feedback equalizer circuit 28, which is used for controlling the feed forward equalizer circuit 26.

Generally, the respective equalizer circuits 26, 28 each have respective parameters, also called filter parameters or filter coefficients, that are set/parameterized in order to define the respective processing of the time and value discrete input signal by the respective equalizer circuits 26, 28.

Figure 3:
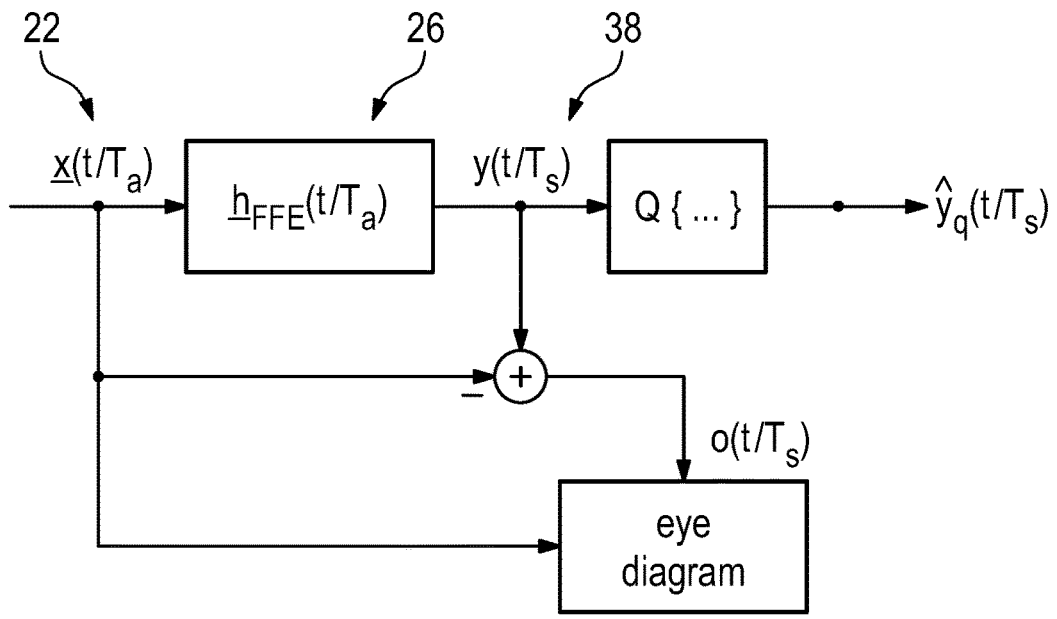
FIG. 3 schematically shows an overview of a feed forward equalizer (FFE) circuit according to one embodiment.
Figure 4:
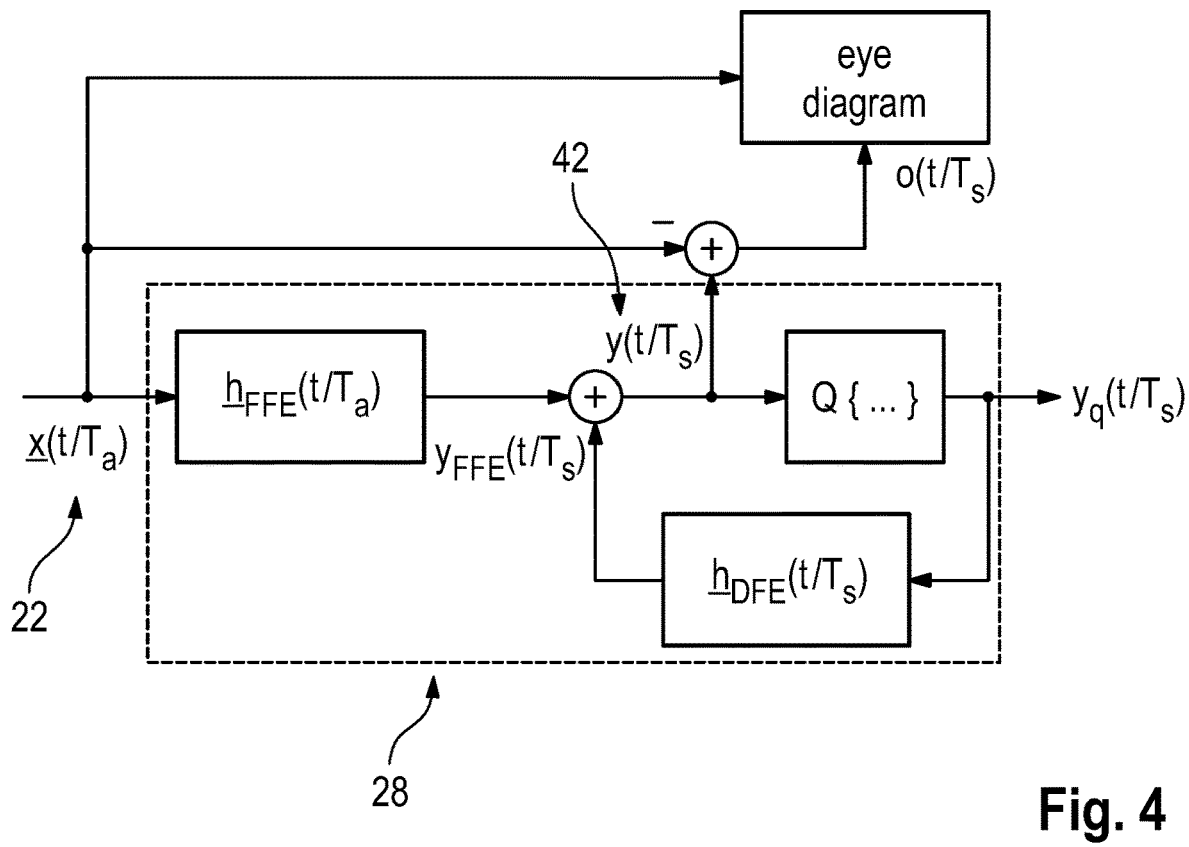
FIG. 4 schematically shows an overview of a decision feedback equalizer (DFE) circuit according to one embodiment.

Example schematic overviews of the equalizer circuits 26, 28 are shown in FIGS. 3 and 4. The FFE circuit 26 shown in FIG. 3 is a finite impulse response (FIR) filter that is used to compensate pre- and post-oscillations of a channel impulse response:

$$y(t/T_s) = \underline{h}_{FFE}^T \cdot \underline{x}(t/T_s)$$

Accordingly, the influence of an inter-symbol interference (ISI) on the symbol decision is reduced, thereby reducing the risk of false decision.

The filter coefficients of the FFE circuit 26 are expressed by the vector $$\underline{h}_{FFE} = [h_0 h_1 \ldots h_{L_{FFE}-1}]^T,$$

with $L_{FFE}$ representing the length of the filter, namely the FFE circuit 26.

Further, the time and value discrete input signal is expressed by the following vector:

$$\underline{x}(t/T_s) = [x(t/T_s) x(t/T_s - T_d/T_s) \ldots x(t/T_s - (L_{FFE}-1) \cdot T_d/T_s)]^T$$

In the formulas, $T_S$ relates to the symbol rate, whereas $T_a$ relates to the sample rate.

In FIG. 3, it is also shown that the symbol decision Q takes place based on the output signal of the FFE circuit 26, wherein the output signal may also be used for generating an eye diagram.

The DFE circuit 28 shown in FIG. 4 is a combination of a finite impulse response (FIR) filter and an infinite impulse response (IIR) filter, thereby providing two filter portions, namely a FIR portion for compensating the pre- and post-oscillations of the channel impulse response as well as an IIR portion for only compensating post-oscillations of the channel impulse response. Hence, the signal processing of the DFE circuit 28 can be expressed as follows:

$$y(t/T_s) = \underline{h}_{FFE}^T \cdot \underline{x}(t/T_s) + \underline{h}_{DFE}^T \cdot \underline{y}_q(t/T_s - 1).$$

The FIR portion of the DFE circuit 28 can be expressed by the vector $$\underline{h}_{FFE} = [h_{FFE,0} h_{FFE,1} \ldots h_{FFE,L_{FFE}-1}]^T$$

and the IIR portion of the DFE circuit 28 can be expressed by the vector $$\underline{h}_{DFE} = [h_{DFE,1} h_{DFE,2} \ldots h_{DFE,L_{DFE}-1}]^T.$$

$L_{FFE}$ represents the length of the FIR filter portion, whereas $L_{DFE}$ represents the length of the IIR filter portion.

The time and value discrete input signal is expressed by the following vector:

$$\underline{x}(t/T_s) = [x(t/T_s) x(t/T_s - T_d/T_s) \ldots x(t/T_s - (L_{FFE}-1) \cdot T_d/T_s)]^T$$

The symbols decided can be expressed by the vector:

$$y_q(t/T_s-1) = Q\{y(t/T_s-1)\}.$$

In FIG. 4, it is shown that the symbol decision Q takes place based on the output signal of the DFE circuit 28, wherein the output signal may also be used for generating an eye diagram. The DFE circuit 28 has a feedback structure.

Generally, the equalizer circuits 26, 28 may be trained by a method of, for example, least squares. In case of the DFE circuit 28, the filter length of the IIR filter portion is set to 0.

The approach, which minimizes the mean square error between the equalized signal $y(t/T_S)$ and transmitted symbols $y_q(t/T_S)$, assumes that the error $e(t/T_S)$ of the equalized signal $y(t/T_s)$ is so small that no symbol error decisions occur in the symbol decision Q. It minimizes the mean square error between equalized signal $y(t/T_S)$ and transmitted symbols $y_q(t/T_S)$:

$$K = [\underline{X}(t/T_s) \cdot \underline{h}_{FFE} + \underline{Y}_q(t/T_s-1) \cdot \underline{h}_{DFE} - \underline{y}_q(t/T_s)]^T \cdot [\underline{X}(t/T_s) \cdot \underline{h}_{FFE} + \underline{Y}_q(t/T_s-1) \cdot \underline{h}_{DFE} - \underline{y}_q(t/T_s)]$$

wherein the matrix of the time and value discrete input signal is expressed by:

$$\underline{X}(t/T_s) = [\underline{x}^T(t/T_s+T_D/T_s) \underline{x}^T(t/T_s+T_D/T_s-1) \ldots \underline{x}^T(t/T_s+T_D/T_s-N+1)]^T$$

and wherein the matrix of the transmitted symbols is expressed by:

$$\underline{Y}_q(t/T_s-1) = [\underline{y}_q^T(t/T_s-1) \underline{y}_q^T(t/T_s-2) \ldots \underline{y}_q^T(t/T_s-N)]^T$$

Moreover, N corresponds to the observation length of the observer. Moreover, the delay $T_D/T_S$ was introduced so that the respective PPE circuit 26 can also compensate for pre-cursors of the channel impulse response. Then, the cost function to be minimized can be expressed as follows $$[\underline{h}_{FFE}^T \underline{h}_{DFE}^T]^T = -\frac{1}{2} \cdot \underline{A}^{-1} \cdot \underline{b}$$

wherein the matrix A corresponds to:

$$\underline{A} = [\underline{X}(t/T_s) \underline{Y}_q(t/T_s-1)]^T \cdot [\underline{X}(t/T_s) \underline{Y}_q(t/T_s-1)]$$

and the vector b corresponds to:

$$\underline{b} = -2 \cdot [\underline{X}(t/T_s) \underline{Y}_q(t/T_s-1)]^T \cdot \underline{y}_q(t/T_s)$$

As mentioned above, the feed forward equalizer circuit 26 and the decision feedback equalizer circuit 28 are communicatively connected with each other via the processing circuit 30. In some embodiments, the filter parameter/coefficient of the feed forward equalizer circuit 26 is set depending on at least one decision feedback equalizer parameter of the decision feedback equalizer circuit 28.

The respective decision feedback equalizer parameter of the decision feedback equalizer circuit 28 may be derived from the output signal of the decision feedback equalizer circuit 28 that has been forwarded to the processing circuit 30. Alternatively, the processing circuit 30 gathers the respective filter parameters of the decision feedback equalizer circuit 28 directly.

In some embodiments, the processing circuit 30 generates a cost function that is minimized in order to find the respective setting of the feed forward equalizer parameter. The cost function may relate to an error squared between the output signals of the respective equalizer circuits 26, 28. Hence, the respective cost function is minimized in order to identify the respective setting for the feed forward equalizer parameter.

The respective cost function to be minimized can be expressed as follows:

$$K = [\underline{X}_{\ddot{a}quFFE}(t/T_s) \cdot \underline{h}_{\ddot{a}quFFE} - \underline{X}(t/T_s) \cdot \underline{h}_{FFE} - \underline{Y}_q(t/T_s-1) \cdot \underline{h}_{DFE})]^T \cdot [\underline{X}_{\ddot{a}quFFE}(t/T_s) \cdot \underline{h}_{\ddot{a}quFFE} - \underline{X}(t/T_s) \cdot \underline{h}_{FFE} - \underline{Y}_q(t/T_s-1) \cdot \underline{h}_{DFE}]$$

The impulse response of the equivalent FFE circuit 26 is expressed by:

$$\underline{h}_{\ddot{a}quiFFE} = [h_0 h_1 \ldots h_{L_{\ddot{a}quFFE}-1}]^T$$

The time and value discrete input signal of the equivalent FFE circuit 26 is expressed by:

$$\underline{X}_{\ddot{a}quFFE}(t/T_s) = [\underline{x}^T(t/T_s+T_{D,\ddot{a}quFFE}/T_s) \underline{x}^T(t/T_s+T_{D,\ddot{a}quFFE}/T_s-1) \ldots \underline{x}^T(t/T_s+T_{D,\ddot{a}quFFE}/T_s-N+1)]^T$$

The cost function K becomes minimized by $$\underline{h}_{\ddot{a}quFFE} = -\frac{1}{2} \cdot \underline{A}^{-1} \cdot \underline{b}$$

wherein the matrix A is $$\underline{A} = \underline{X}_{\ddot{a}quFFE}^T(t/T_s) \cdot \underline{X}_{\ddot{a}quFFE}(t/T_s)$$

And wherein the vector b is:

$$\underline{b} = -2 \cdot \underline{X}_{\ddot{a}quFFE}^T(t/T_s) \cdot [\underline{X}(t/T_s) \cdot \underline{h}_{FFE} + \underline{Y}_q(t/T_s-1) \cdot \underline{h}_{DFE}]$$

As shown in FIG. 1, the parallel filter structure 20 is implemented on a single chip 32, for instance an application-specific integrated circuit (ASIC). The chip 32 may have a real time section 34 as well as a non-real time section 36 that are used for different purposes. The feed forward equalizer circuit 26 is implemented in the real time section 34, whereas the decision feedback equalizer circuit 28 is implemented in the non-real time section 36 of the chip 32.

Further, the parallel filter structure 20 comprises at least one (output) interface 38 that is associated with the feed forward equalizer circuit 26 such that the output signal of the feed forward equalizer circuit 26 is fed to the interface 38 that may be associated with a trigger circuit 40.

The trigger circuit 40 may be part of the parallel filter structure 20 such that the trigger circuit 40 is also implemented on the chip 32. Alternatively, the trigger circuit 40 is established as a separately formed circuit that is provided on a separately formed chip within the oscilloscope 10.

Further, the parallel filter structure 20 may comprise another output interface 42 that is associated with the decision feedback equalizer circuit 28 such that the output signal of the decision feedback equalizer circuit 28 is fed to the output interface 42 that is associated with an eye diagram circuit 44. The eye diagram circuit 44 may be implemented on the chip 32 or on a separately formed chip that is connected with the chip 32 on which the parallel filter structure 20 is implemented.

The parallel filter structure 20, for example the parallel circuit 24, ensures that the output signals of the different equalizer circuits 26, 28 are equivalent with each other since the filter parameters of the feed forward equalizer circuit 26 are set accordingly as described above. The equivalence is ensured by minimizing the cost function, namely the error squared between the output signals of the equalizer circuits 26, 28. Accordingly, both equalizer circuits 26, 28 have the same transfer function, resulting in similar or equivalent equalizing functions.

Therefore, the oscilloscope 10 is enabled to provide a real-time processing wherein the equalization functions have the same characteristics in a triggering path and a displaying path of the oscilloscope 10.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein.

In an embodiment, circuitry includes circuits, such as, for example, microprocessors or portions of microprocessor, that require software, firmware, and the like for operation.

In an embodiment, circuitry includes an implementation comprising one or more processors or portions thereof and accompanying software, firmware, hardware, and the like.

Various embodiments are described above with reference to block diagrams and/or flowchart illustrations of apparatuses, methods, systems, and/or computer program instructions or program products. It should be understood that each block of any of the block diagrams and/or flowchart illustrations, respectively, of portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory (including volatile and non-volatile media). or portions thereof, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by The embodiments of the invention in which an exclusive property or privilege is claimed are defined as follows:

1. A parallel filter structure for processing a signal, the parallel filter structure comprising:
   a processing circuit;
   a signal input configured to receive a time and value discrete input signal;
   a feed forward equalizer circuit connected with the signal input for receiving the time and value discrete input signal; and
   a decision feedback equalizer circuit connected with the signal input for receiving the time and value discrete input signal,
   wherein the feed forward equalizer circuit and the decision feedback equalizer circuit together form a parallel circuit, wherein the feed forward equalizer circuit and the decision feedback equalizer circuit both are connected with the signal input such that the feed forward equalizer circuit and the decision feedback equalizer circuit both process the same time and value discrete input signal in parallel that was received via the signal input, and wherein the feed forward equalizer circuit and the decision feedback equalizer circuit both provide output signals in parallel via separate output interfaces, wherein the output signals are forwarded to the processing circuit that processes the respective output signals.

2. The parallel filter structure according to claim 1, wherein the feed forward equalizer circuit and the decision feedback equalizer circuit are communicatively connected with each other.

3. The parallel filter structure according to claim 1, wherein at least one feed forward equalizer parameter of the feed forward equalizer circuit is set depending on at least one decision feedback equalizer parameter of the decision feedback equalizer circuit.

4. The parallel filter structure according to claim 3, wherein the dependency is determined based on a minimum of a cost function.

5. The parallel filter structure according to claim 4, wherein the processing circuit is configured to minimize the cost function.

6. The parallel filter structure according to claim 4, wherein the cost function comprises the error squared between an output signal of the feed forward equalizer circuit and an output signal of the decision feedback equalizer circuit.

7. The parallel filter structure according to claim 1, wherein the parallel filter structure is implemented on a single chip.

8. The parallel filter structure according to claim 7, wherein the parallel filter structure is implemented on an application-specific integrated circuit (ASIC).

9. The parallel filter structure according to claim 7, wherein the feed forward equalizer circuit is implemented in a real time section of the chip.

10. The parallel filter structure according to claim 7, wherein the decision feedback equalizer circuit is implemented in a non-real time section of the chip.

11. The parallel filter structure according to claim 1, wherein an output signal of the feed forward equalizer circuit is fed to an interface for a trigger circuit.

12. The parallel filter structure according to claim 11, wherein the parallel filter structure further comprises the trigger circuit that is connected with the feed forward equalizer circuit.

13. The parallel filter structure according to claim 1, wherein an output signal of the decision feedback equalizer circuit is fed to an interface for an eye diagram circuit.

14. The parallel filter structure according to claim 13, wherein the parallel filter structure further comprises the eye diagram circuit that is connected with the decision feedback equalizer circuit.

15. An oscilloscope comprising the parallel filter structure according to claim 1.

16. The oscilloscope according to claim 15, wherein the oscilloscope further comprises a trigger circuit that is connected with an interface associated with the feed forward equalizer circuit that is separately formed with respect to the trigger circuit.

17. The oscilloscope according to claim 15, wherein the oscilloscope further comprises an eye diagram circuit that is connected with an interface associated with the decision feedback equalizer circuit that is separately formed with respect to the eye diagram circuit.

18. A method of processing a signal, wherein the method comprises the steps of:
   receiving a time and value discrete input signal via a signal input;
   filtering the time and value discrete input signal by a feed forward equalizer circuit of a parallel filter structure; and
   filtering the time and value discrete input signal by a decision feedback equalizer circuit of the parallel filter structure, which together with the feed forward equalizer circuit forms a parallel circuit of the parallel filter structure,
   wherein the parallel filter structure comprises a first output interface associated with the feed forward equalizer circuit such that an output signal of the feed forward equalizer circuit is fed to the first output interface, wherein the parallel filter structure is connectable with a separately formed chip on which a trigger circuit is provided via the first output interface,
   wherein the parallel filter structure comprises a second output interface associated with the decision feedback equalizer circuit such that an output signal of the decision feedback equalizer circuit is fed to the second output interface, wherein the parallel filter structure is connectable with a separately formed chip on which an eye diagram circuit is provide via the second output interface, and wherein the first output interface and the second output interface are separate output interfaces.

19. The method according to claim 18, wherein at least one feed forward equalizer parameter of the feed forward equalizer circuit is set depending on at least one decision feedback equalizer parameter of the decision feedback equalizer circuit.

20. A parallel filter structure for processing a signal, the parallel filter structure comprising:
   a processing circuit;
   a signal input configured to receive a time and value discrete input signal;
   a feed forward equalizer circuit directly connected via a first line with the signal input for receiving the time and value discrete input signal; and
   a decision feedback equalizer circuit directly connected via a second line with the signal input for receiving the time and value discrete input signal, wherein the feed forward equalizer circuit and the decision feedback equalizer circuit together form a parallel circuit, wherein the feed forward equalizer circuit and the decision feedback equalizer circuit both are connected with the signal input such that the feed forward equalizer circuit and the decision feedback equalizer circuit both process the same time and value discrete input signal in parallel that was received via the signal input, and wherein the feed forward equalizer circuit and the decision feedback equalizer circuit both provide output signals in parallel that are forwarded to the processing circuit that processes the respective output signals.

\* \* \* \* \*